(12) United States Patent
Chapman

(10) Patent No.: US 6,342,539 B1
(45) Date of Patent: Jan. 29, 2002

(54) NON-METALLIC CONSTITUENT COMPONENTS OF PRINTED WIRING ASSEMBLIES AND PRINTED WIRING BOARDS

(75) Inventor: Ray Chapman, Argyle, TX (US)

(73) Assignee: Resource Concepts, Inc., Dallas, TX (US)

( * ) Notice: Subject to any disclaimer, the term of this patent is extended or adjusted under 35 U.S.C. 154(b) by 0 days.

(21) Appl. No.: 08/939,086

(22) Filed: Sep. 26, 1997

Related U.S. Application Data

(62) Division of application No. 08/582,780, filed on Jan. 4, 1996, now Pat. No. 5,829,694.

(51) Int. Cl.$^7$ ................................................ C08J 11/04
(52) U.S. Cl. ........................ 521/40; 523/457; 241/79.1; 241/152.2; 241/DIG. 38
(58) Field of Search ................................ 523/466, 457; 241/79.1, 152.2, DIG. 38; 521/40

(56) References Cited

U.S. PATENT DOCUMENTS

| | | | | |
|---|---|---|---|---|
| 2,942,792 A | * | 6/1960 | Anderson et al. | 241/14 |
| 3,848,813 A | * | 11/1974 | Stanczyk et al. | 241/19 |
| 3,885,744 A | * | 5/1975 | Drage | 241/23 |
| 3,905,556 A | * | 9/1975 | Drage | 241/24 |
| 4,026,477 A | * | 5/1977 | Tremolada | 241/17 |
| 4,042,177 A | * | 8/1977 | Cestaro et al. | |
| 4,044,956 A | * | 8/1977 | Benedetto et al. | |
| 4,098,464 A | * | 7/1978 | Niedner et al. | |
| 4,384,683 A | * | 5/1983 | Huwald et al. | |
| 4,397,424 A | * | 8/1983 | Zappa et al. | |
| 4,414,076 A | * | 11/1983 | Tabatabaie-Alavi | |
| 4,494,995 A | * | 1/1985 | Tabatabaie-Alavi | |
| 4,637,928 A | * | 1/1987 | Zajac, Jr. et al. | |
| 4,815,668 A | * | 3/1989 | Frei | |
| 5,139,203 A | * | 8/1992 | Alavi | |
| 5,217,171 A | * | 6/1993 | Feldman | |
| 5,356,082 A | * | 10/1994 | Prinz et al. | |
| 5,377,920 A | * | 1/1995 | Alavi et al. | |
| 5,630,554 A | | 5/1997 | Izumikawa et al. | 241/14.13 |
| 5,652,042 A | | 7/1997 | Kawakita et al. | 252/511 |
| 5,676,318 A | | 10/1997 | Yokoyama et al. | 241/24.14 |
| 5,914,358 A | | 6/1999 | Kawatika et al. | 523/457 |

FOREIGN PATENT DOCUMENTS

| | | | |
|---|---|---|---|
| JP | 5-329841 | * | 12/1993 |
| JP | 7-602227 | * | 3/1995 |
| JP | 7-246382 | * | 9/1995 |

OTHER PUBLICATIONS

R.S. Kaplan and H. Ness. "Review Article No. 13–Recyling of Metals"—Conservation & Recycling, vol. 10, No. 1, pp. 1–13, 1987, Printed in Great Britain.*

Lji, M. et al., "Recycling of plastics wastes from electronic parts production processes" RILEM Proc. (1995), 27 (Disposal and Recycling of Organic Polymeric Contruction Materials) 126–136. (Abstract)*

Patent Abstracts of Japan, Unexamined Applications, Section: M, Sect. No. 1576, vol. 18, No. 151, P. 153 (19940314).*

Patent Abstracts of Japan, (CD–ROM), Unexamined Applications, vol. 95, No. 9.*

Patent Abstracts of Japan, (CD–ROM), Unexamined Applications, vol. 95, No. 3.*

* cited by examiner

Primary Examiner—Ngoclan Mai
(74) Attorney, Agent, or Firm—R. Darryl Burke; McKool Smith, P.C.

(57) ABSTRACT

An apparatus separates a substantially metallic portion from a substantially non-metallic portion or constituent components of at least one electrical product, comprising a plurality of crushing machines, such as a first crushing machine and a second crushing machine and a separating machine. The first crushing machine crushes the at least one electrical product to create at least one crushed electrical product. The first crushing machine has a first screen affixed thereto to regulate a first flow of the at least one first crushed electrical product from the first crushing machine. The second crushing machine crushes the at least one first crushed electrical product to create at least one second crushed electrical product. The second crushing machine has a second screen affixed thereto to regulate a second flow of the at least one second crushed electrical product from the second crushing machine. At least one separating machine receives the at least one second crushed electrical product from the second crushing machine to separate into three general categories: the metallic portion, the non-metallic portion, and a mixed portion having metallic and non-metallic subportions. The mixed portion are directly returned to said second crushing machine to be recrushed and indirectly to at least one separating machine to be reevaluated. A plurality of conveyors may also be used to transport the at least one first crushed electrical product from the first crushing machine to the second crushing machine, the at least one second crushed electrical product from the second crushing machine to the at least one separating machine. A plurality of air separators may be used to remove non-metallic light weight materials from the crushed electronic products and deposit the non-metallic light weight materials in a collection bin.

32 Claims, 3 Drawing Sheets

NON-METALLIC CONSTITUENT COMPONENTS OF PRINTED WIRING ASSEMBLIES AND PRINTED WIRING BOARDS

CROSS-REFERENCE TO RELATED APPLICATIONS

This application is a division of Ser. No. 08/582,780 filed Jan. 4, 1996 now Pat. No. 5,829,694.

PARTIAL WAIVER OF COPYRIGHT PURSUANT TO 1077 O.G. 22(Mar. 20, 1987)

© Copyright, Ray Chapman 1996. All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright rights has no objection to the facsimile reproduction by anyone of the patent document or patent disclosure, as it appears in the United States Patent and Trademark Office patent file or records, but otherwise reserves all copyright rights whatsoever.

FIELD OF INVENTION

In general, the present invention relates to an apparatus and process for separating the constituent components of Printed Wiring Assemblies (hereinafter "PWA's") and Printed Wiring Boards (hereinafter "PWB's") (i.e., the unpopulated boards and trim scrap from which the unpopulated boards are produced). In particular, the invention relates to a dry, mechanical process and an associated apparatus whereby PWA's or PWB's are successively and repeatedly crushed into a granular mixture of materials, which may be separated into granular forms of non-metallic and metallic constituent components suitable for reclamation, recycling, and reuse.

ultimately, packaged in various electrical or electronic equipment and appliances (i.e., plastic compartments). PWA's have become ubiquitous in such items as personal and business computers, telecommunications equipment, television sets, and other consumer electronic systems. Normal wear-and-tear and the extraordinary rate of technological change in the capabilities PWA's and PWB's have combined to produce a dramatic increase in the amount of obsolete electronic equipment produced in recent years. Despite the fact that much of this unusable or unwanted equipment contains a multitude of hazardous ingredients including copper and lead, much of this equipment is disposed of by simply placing it in private or municipal landfill sites. This approach is problematic for a variety of reasons. For instance, this approach has the potential for leaking toxic materials into the environment (i.e., water table). In addition, this approach unnecessarily dedicates limited landfill capacity. Consequently, consumer, business, and governmental entities are increasingly directed at the ecologically sound disposal of such equipment and have an intensifying interest in recycling the raw materials such equipment contains.

The disposal of PWA's and PWB's, however, involves special problems. Some of the special problems of properly disposing and/or recycling electrical/electronic equipment and appliances relate to the manner in which PWA's and PWB's are manufactured. PWB's are made by laminating two or more layers of fiberglass reinforced epoxy or polyimide resins with copper foil. The laminate is then coated with a metallic material, usually copper, upon which circuits are traced by a variety of imaging and etching techniques. In addition to quality defects that produce unusable PWB's, the process for producing finished, etched PWB's creates up to 20% waste as trim scrap. Because the material from which PWB's are made is a thermoset, the base can not be remelted and reused once it is produced. Similarly, PWA's are produced from PWB's by soldering or otherwise affixing functional components, such as chips having integrated circuits (hereafter "IC's"), connectors and other components to the base. The composition of these components includes such precious metals as Gold, Silver, Palladium and Platinum, which are encapsulated in ceramic or epoxy resins.

| Docket No. | Patent/Serial No. | Filing Date/Issue Date | Title |
| --- | --- | --- | --- |
| 3685-002000 | 08-582,788 | 01/04/96, Patent No. 5,829,694 | Apparatus and systems thate separate and Isolate previous and sent to precious metals from electronic circuit boards |
| 3685-002001 | 08-582,784 | 01/04/96 | Process for the separation and Isolation of precious and semi-precious metals from electronic circuit |
| 3685-002003 | 08-582,788 | 01/04/96 | Process that separate and Isolate precious and semi-precious metals from electronic circuit boards |

BACKGROUND

Over the past three decades, since the inception of the integrated circuit and the computer, consumer acceptance combined with technological advances has produced an exceptionally strong market for electrical/electronic products that use integrated circuits and computers for the distribution and manipulation of information and data. The integrated circuits are often encapsulated in ceramic packages, mounted on PWB's to form PWA's, and, Some existing techniques dispose of PWA's and PWB's in the following fashion. PWA's may be stripped of any reusable components. The partially depopulated PWA's are then sent to a smelter where they are pyrolized to burn off volatile constituents and then crushed. The resulting ash is then reduced by melting and the precious and semi-precious metals are recovered through several pyrometallurgical stages. The value of the precious metals is then calculated, after subtracting the cost of the smelting process, and this value is returned to the supplier of the PWA's.

This process has several disadvantages when complete PWA's are sent directly to smelters:

the smelting process is inherently costly in term of energy usage;

the pryolsis process produces air pollutants that must be scrubbed from oven stacks or otherwise converted into carbon dioxide, which is an environmentally unfriendly substance;

the resulting "sludge" from the smelting process is returned to the landfill, which uses up limited landfill capacity and, in some circumstances, may leak into the environment; and sampling techniques to determine the precious metal content of the PWA's prior to the smelting operation are impractical and unreliable.

Alternatives to the direct smelting of PWA's include techniques that seek to separate various metal constituent components from the non-metallic constituent components of complete electrical/electronic systems. These techniques include mechanical crushing of electrical/electronic units followed by magnetic separation to remove ferrous metals, followed either by sink flotation techniques to remove lighter weight non-metallic or metallic constituent components; or by density separation techniques followed by treatment of the resulting metallic or non-metallic portions with strong acids, bases or toxic cyanide; or by elaborate series of grinding and density separation steps to completely separate such metals as copper from aluminum and nickel. These approaches still require hazardous components such as Cathode Ray Tubes (CRTs), mercury switches, and Polychlorobiphenly containing capacitors, frequent components of electronic assemblies, to be removed manually. In addition, they involve chemical or water treatment that requires careful and costly monitoring of effluents for hazardous ingredients and/or are costly with respect to the value of the reclaimed materials.

SUMMARY

Generally, in preferred embodiments, PWA's, are removed from electrical or electronic systems, either manually or by a gross shredding operation that is performed on the assembled unit after hazardous items, such as CRTs, mercury switches and Polychlorobiphenyl containing capacitors, are removed. Alternatively, PWB's are simply provided to preferred embodiments. Then, PWB's and/or PWA's are successively and continuously crushed to reduce the overall size of the constituent components. The resulting constituent components contain a mixture of metallic and non-metallic base materials and are separated from one another using the specific gravity of the fractions of material produced. This mechanical process of repeated size reduction and separation generally renders PWA's or PWB's into three fractions: (A) a granular form of the metallic constituent that allows reproducible and reliable chemical analysis of its elemental composition and permits efficient reclamation of the precious elements through subsequent refining processes; (B) a finely ground form of non-metallic PWB base material, generally comprising fiberglass and epoxy or polyimide resin, a "fines" fraction; and (C) an extremely finely ground form of non-metallic dust generally comprising the fiberglass and binding resins from the PWB base. These fractions are produced in various proportions depending on the composition of the PWA or PWB feed stock. Fractions (B) and (C) may be combined, together or separately, with other materials to produce composites that may be used in construction or industrial applications. These applications include, but are not limited to, sinks, desktops, highway lane dividers, highway sound barriers, electronic component cases, chemically resistant floor grating, tile, shingles, molding compounds, highway speed regulators, kitchen and bathroom countertops, and wallboard. Therefore, all components of PWA's or PWB's can be returned to constructive use rather than being placed in landfill sites. Because this process is completely dry and requires no incineration or chemical treatment steps, associated problems of monitoring effluent water, air or chemical waste streams are avoided.

Specifically, preferred embodiments of the apparatus that are used to separate metallic and non-metallic constituent components from various types of PWA's/PWB's comprise a plurality of crushing machines, a plurality of screens, and a plurality of separators. Each crushing machine (i.e., ring mills, radial knife granulators, roll crushers, jaw crushers, ball mills, disk granulators, impact mills, and hammer mills) has a crushing machine entry port and a crushing machine exit port. In addition, each crushing machine of the plurality of crushing machines has at least one screen of the plurality of screens affixed thereto and positioned to screen each crushing machine exit port to selectively allow passage of specifically sized products. The specifically sized products passed through a first screen are larger than the specifically sized products allowed to be passed through a second screen, wherein the first screen precedes the second screen. Preferred embodiments use two (2) crushing machines. The at least one separating machine receives products from the crushing machine exit port of at least one crushing machine of the plurality of crushing machines via a plurality of conveyors, such as a belt conveyor and a closed conveyor. The at least one separating machine (i.e., a gravity separator, such as a fluidized bed separator, electrostatic separators, electrodynamic separators, vibrating screen separators, and destoners) separates the at least one electronic products into the non-metallic constituent components, the metallic constituent components, and into a grouping of mixed constituent components. Note the metallic constituent components are generally heavier than the non-metallic constituent components; the metallic constituent components generally have a higher specific gravity than the non-metallic constituent components. The grouping of mixed constituent components is transported to one crushing machine entry port of one crushing machine of the plurality of crushing machines via a feedback mechanism, such as one as a conveyor, to form a closed loop for further size reduction and ultimate separation. Note that a plurality of conveyors can also be collectively used as a feedback mechanism. Each conveyor has a conveyor entry port and a conveyor exit port. A first conveyor of the plurality of conveyors is positioned is transport the at least one electronic component to a first crushing machine entry port of a first crushing machine of the plurality of crushing machines. The at least one second conveyor of the plurality of conveyors is positioned to receive and transport at least one first crushed electronic component crushed by the first crushing machine from the first crushing machine exit port to the second crushing machine entry port of the second crushing machine of the plurality of crushing machines.

In addition, in preferred embodiments, at least one opening of the plurality of openings of the first screen allow passage of specifically sized products having diameters between $\frac{1}{16}$" and 2" and at least one opening of the plurality of openings of the second screen allow passage of specifically sized products having diameters between $\frac{1}{16}$" and 1". Similarly, a least one opening of the plurality of openings of the first screen allows passage of specifically sized products having diameters between ¾" and 1" and at least one opening of the plurality of openings of the second screen allows passage of specifically sized products having diameters between ³⁄₁₆" and ⅜". Preferred embodiments may also comprise a plurality of air separators (i.e., a cyclone air separator, Air Classifiers, Air Stratifyers, Centrifugal Air Classifiers, Venturi Separators, Trickle Vane Separators, and Rising Current Density Separators). Each air separator has an air separator entry port and an air separator exit port. Each air separator entry port is positioned to remove light weight materials from the at least one crushed electronic product. Each air separator removes dust from the light weight materials and returns the light weight materials to one conveyor of the plurality of conveyors. Each air separator exit port is mechanically linked with a collection apparatus (i.e., a bag house filter) to filter and gather the dust. A shredder may also be used to shred the at least one electronic product to create at least one shredded electronic component. The at least one shredded electronic component is then transferred to the first crushing machine entry port of the first crushing machine. Belt conveyors can be used to transfer material to and from the shredder. The first crushing machine, the second crushing machine, and the separator may be maintained under a partial vacuum to permit collection of dust in a closed collector.

Preferred processes to separate metallic and non-metallic constituent components of at least one electronic product are generally comprised of the following steps: (a) repeatedly crushing the at least one electronic product to create a plurality of crushed electronic components; (b) repeatedly screening the plurality of crushed electronic components to ensure that the plurality of crushed electronic components substantially conform to a specific size; and (c) repeatedly separating portions of the plurality of crushed electronic components after steps (a) and (b) into non-metallic constituent components, metallic constituent components and mixed constituent components by weight, the mixed constituent components having both non-metallic constituent components and metallic constituent components; and (d) returning the mixed constituent components to be recrushed, rescreened, and reseparated in steps (a), (b), and (c). In addition, before step (a), the at least one electronic product must be provided or otherwise transported to crushing machines to perform step (a). Likewise, the crushed electronic components must be transported from one crushing machine to another crushing machine and to the separating apparatus to perform step (c). The crushed electronic products are also periodically screened, such as after each crushing step to limit the size of the crushed materials in the stream of crushed materials being evaluated. Portions of the light weight material that comprise metallic material are preferably returned to the stream of crushed material. Lightweight material is also removed from the stream of crushed materials by at least one air separator. Portions of lightweight material substantially comprised of non-metallic materials (i.e., dust) are transported to a collection apparatus. The products can be shredded before step (a).

Preferred embodiments provide a number of advantages. Preferred embodiments substantially (and in some cases completely) recycle the constituents/components of PWA's and PWB's by separating the metallic from the non-metallic constituent components of which they are made and return all of these raw materials to reuse rather than sending them to a landfill, thereby reducing the dedication of limited landfill space to the disposal of electrical/electronic equipment. Preferred embodiments do not require incineration or chemical or water treatment procedures, which avoids potential problems with air or water pollution, to separate metallic and non-metallic constituent components of PWA's/PWB's. In addition, preferred embodiments perform the separation and recovery of metallic and non-metallic constituent components in a cost efficient way and in a manner that reclaims the maximum amount of precious and semiprecious metals from these materials.

Other advantages of the invention and/or inventions described herein will be explained in greater detail below.

BRIEF DESCRIPTION OF THE DRAWINGS

The accompanying drawings are incorporated into and form a part of the specification to illustrate several examples of the present inventions. These drawings together with the description serve to explain the principles of the inventions. The drawings are only for the purpose of illustrating preferred and alternative examples of how the inventions can be made and used and are not to be construed as limiting the inventions to only the illustrated and described examples. Further features and advantages will become apparent from the following and more particular description of the various embodiments of the invention, as illustrated in the accompanying drawings, wherein.

DETAILED DESCRIPTION OF THE PREFERRED EMBODIMENT

Figure 1:
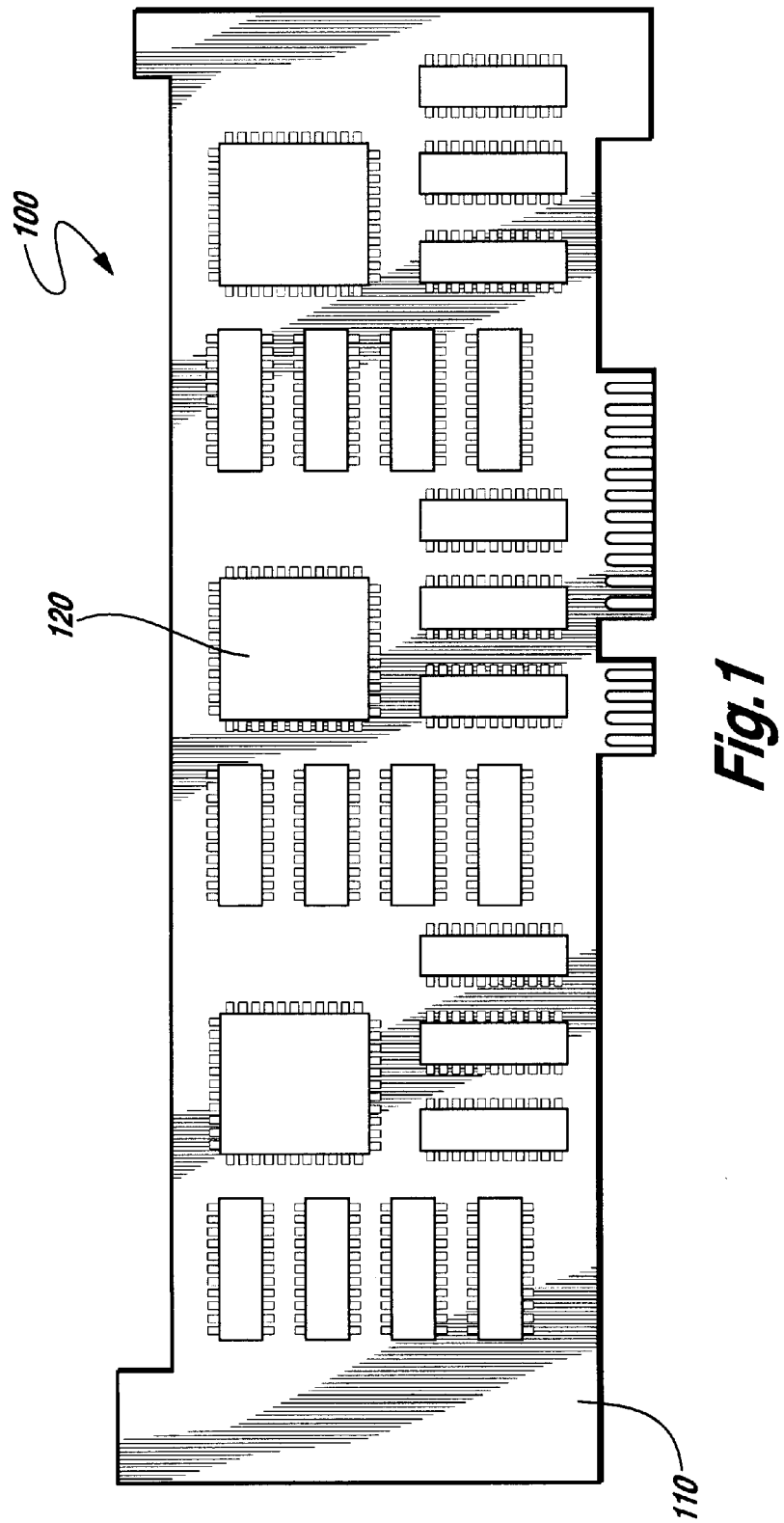
FIG. 1 is a top view of an illustration of a sample of a printed wiring assembly ("PWA") 100 having a printed wiring board ("PWB") 110 with electrical components 120 (i.e., encapsulated integrated circuits) placed thereon.

The present inventions will be described by referring to the preferred apparatus and method and by showing various examples of how the inventions disclosed herein can be made and used. When possible, like reference characters are used throughout the several views of the drawing to indicate like or corresponding parts.

Figure 2:
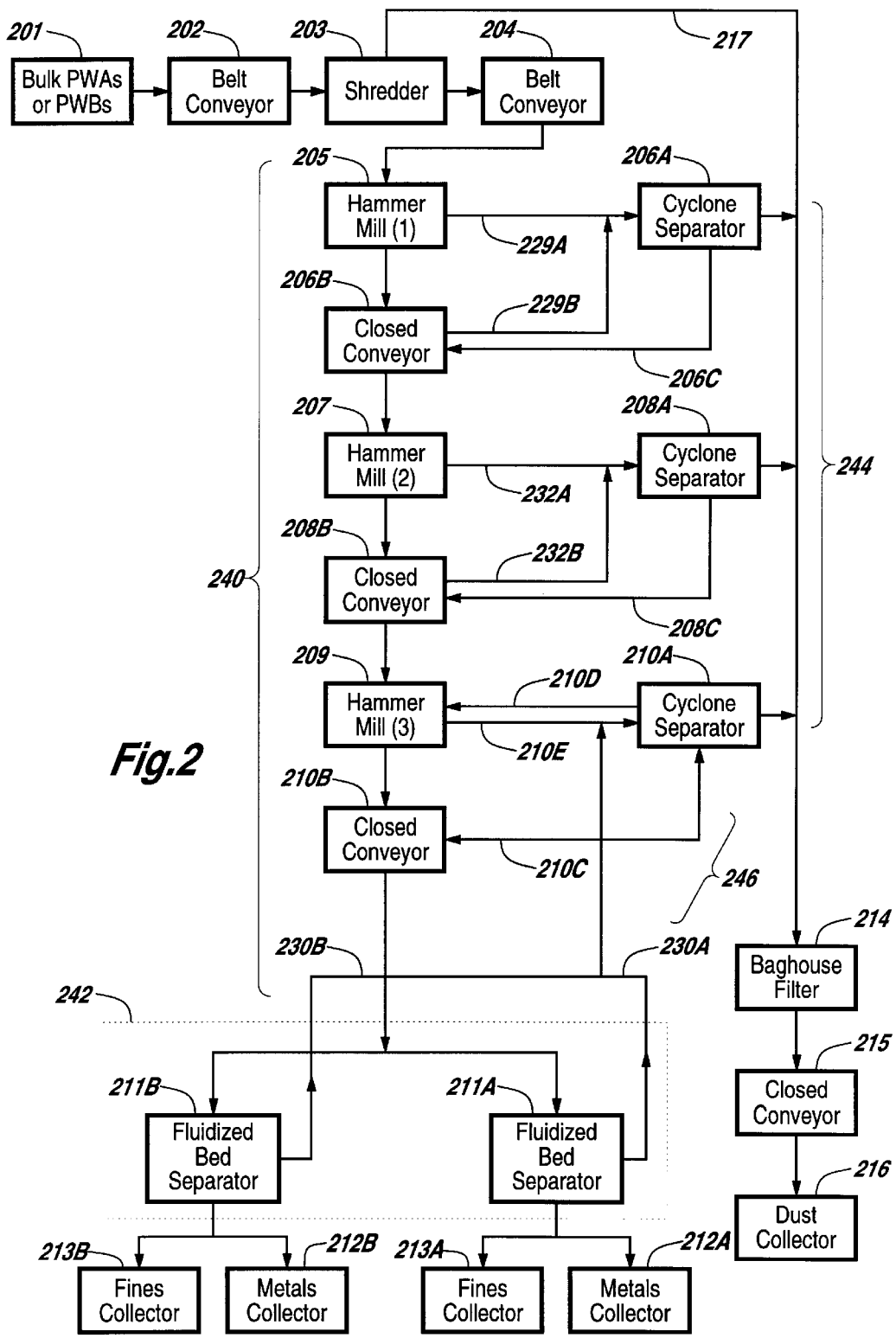
FIG. 2 is diagram illustrating the process flow 200 of a preferred processes to separate metallic and non-metallic components of PWA 100 and PWB 110.
Figure 3:
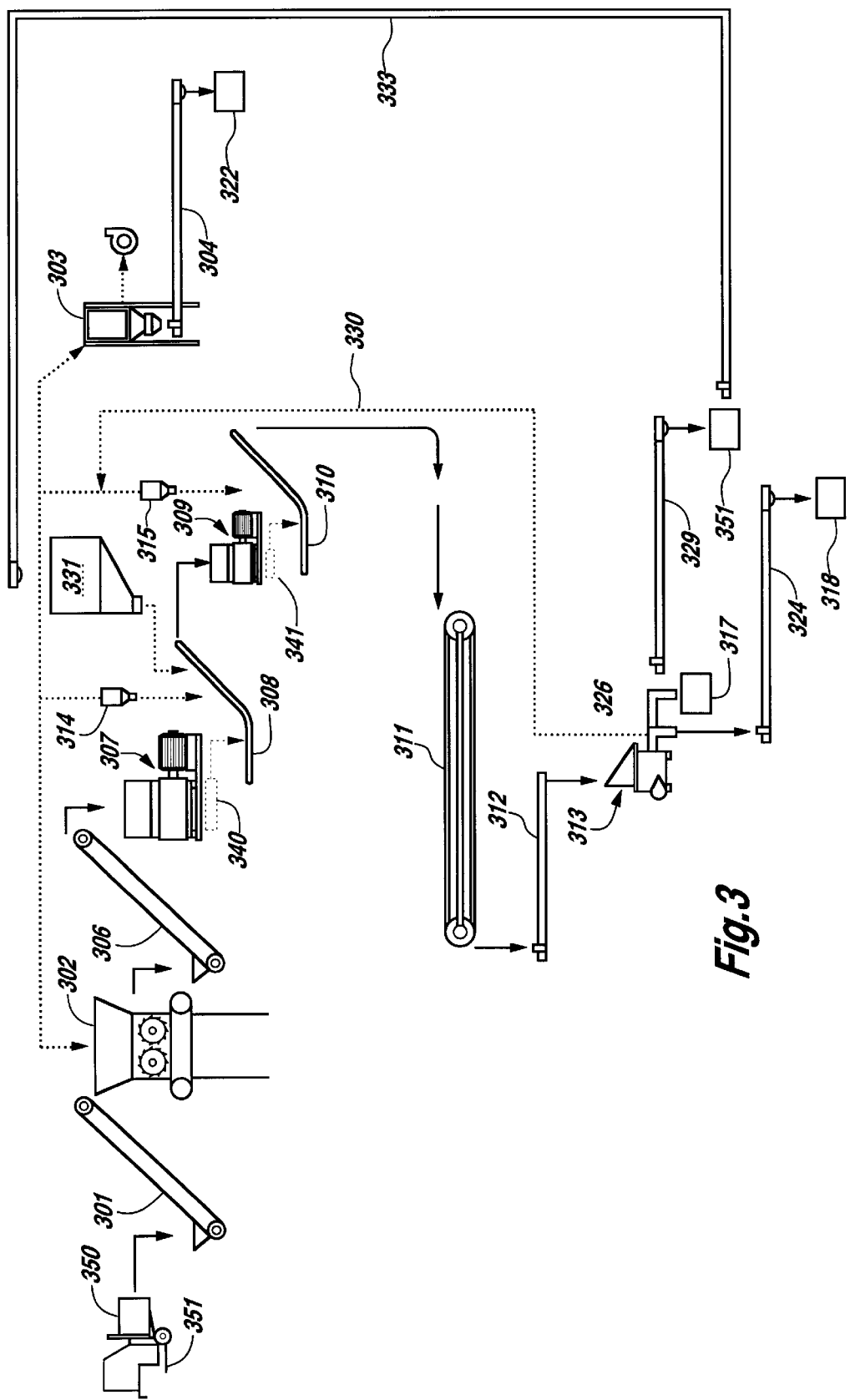
FIG. 3 is a diagram of a preferred embodiment showing the manufacturing line 300 used to implement the preferred process shown in FIG. 2.

Referring to FIG. 2, as an overview, please note that first grouping 240 corresponds to a group of steps that generally crush and reduce the results from shredder 203 in FIG. 2 and shown as 302 in FIG. 3 in size; second grouping 241 corresponds to a group of steps that separate the crushed electrical and/or electronic components into a grouping of non-metallic constituent components, a grouping of metallic constituent components, and a grouping of mixed metallic and non-metallic constituent components; and third grouping 244 corresponds to a group of steps that return the grouping of mixed metallic and non-metallic constituent components to be recrushed and reseparated.

As shown in the flow diagram 200 in FIG. 2, step 201 entails providing bulk quantities of PWA's and/or PWB's, such as PWA 100 and/or PWB 110 having IC's 120 shown in FIG. 1 and container 350 being transported by forklift 351 in FIG. 3. Step 202 entails the placement of PWA's 100 and/or PWB's 110 onto belt conveyor 301 (in FIG. 3), which transports PWA's 100 and/or PWB's 110 into shredder 302 (in FIG. 3). Step 203 entails the shredding of these PWA's/PWB's, whereby they are reduced in size to figments nominally 3" in size. Shredder 302 is the primary shredder, but additional shredders can be used. Because shredder 302 is maintained under a (partial) vacuum, dust produced by the shredding operation is transported via a duct 352 in FIG. 3 (shown as path 217 in FIG. 2) to a baghouse dust filter 303 in FIG. 3, which collects the dust, as shown in step 214 in FIG. 2. The dust is transported via closed conveyor 304 to dust collector 322 in FIG. 3, as shown in steps 215 and 216 in FIG. 2.

Step 204 in FIG. 2 shows the results from shredder 302 being transported via belt conveyor 306 in FIG. 3 into a first crushing machine, such as first hammer mill 307 in FIG. 3 or another piece of crushing equipment, like a ring mill. Step 205 refers to the crushing action of the first crushing machine, such as the hammers of hammer mill 307 or grinding rings of a grinder, combined with natural abrasion of the crushed particles against one another to reduce the size of the particles in it. Step 205 produces a mixture of material with a range of specific gravity, depending upon the metal content and diameter of the particles. First hammer mill 307 is fitted with a first screen 340 at its exit port with the diameter of screen openings in the approximate range of 1/16" to 2", preferably in the range of 3/4" to 1". Consequently, the exit stream from first hammer mill 307 preferably contains particles with a maximum diameter equal to the diameter of screen openings of first screen 340. The exit stream from first hammer mill 307 is fed to first closed conveyor 308, referred to by step 206B in FIG. 2, and then into a second crushing machine, such as second hammer mill 309 (in FIG. 3) or another alternate piece of crushing equipment like a ring mill, which is referred to by step 207 in FIG. 2. Second hammer mill 309 provides for further size reduction of the particles crushed by first hammer mill 307. Second hammer mill 309 preferably contains a second screen 341 which has openings with a diameter in the approximate range of 1/16" to 1", preferably in the range of 3/16"–3/8". Once again, particles exiting second hammer mill 309 have a maximum diameter equal to the diameter of the openings of the second screen 341. As referenced in step 208B in FIG. 2, the exit stream from second hammer mill 309 is then fed via second closed conveyor 310 (along with third belt conveyor 311 and third closed conveyor 312) to fluidized bed separator 313 in FIG. 3, which is referred to by step 211. Note, additional fluidized bed separators may be used.

As discussed above, first hammer mill 307 and second hammer mill 309 are maintained under a (partial) vacuum, so that lighter weight portions, which may contain some metallic material from the feed-stock of crushed PWA's/PWB's are transported to first cyclone air separator 314 and second cyclone air separator 315 in FIG. 3, respectively. Steps 206A and 208A in FIG. 2 denote this operation, respectively. The configuration of first cyclone air separator 314 and second cyclone air separator 315 further separates these lighter weight portions and allows heavy particles from such airborne mixtures to fall, under the force of gravity, into first closed conveyor 308 and second closed conveyor 310, respectively, where these particles are returned to the processing stream to enrich the processing stream with heavy weight particles, as illustrated by paths 206D and 208D in FIG. 2. Once again, as discussed above in reference to shredder 302, dust particles that are generally comprised of non-metallic substances from first cyclone air separator 314 and second cyclone air separator 315 are transported via ducts 352 (shown in path 217 in FIG. 2) to baghouse 303 in FIG. 3 and ultimately via fourth closed conveyor 304 to dust collector 322, which are highlighted by steps 214, 215, and 216 in FIG. 2.

Referring to first gravity separator 313, such as a fluidized fed separator, the dry granular mixture of materials found in the process stream flows over a inclined, vibrating, and screen-covered deck or separating bed. The action of air blown from below the deck and vacuum pulling from above the deck produces a fluidized bed of air upon which the mixture of size reduced metals and non-metallic base floats as the deck vibrates. This action causes light materials to "bounce" down the inclined, vibrating deck, as heavier material, such as the finely divided metallic portions of the mixture, travel up the inclined deck. The effect of this movement separates the mixture into a number of portions (or streams) of particles that are separated according to the differences in their specific gravity. The portions include, but are not limited to, a first portion of finely ground metals typically denoted as "metals" at the top of the deck (referred to as step 211B in FIG. 2), a second portion of finely ground non-metallic base material or "fines" at the bottom of the deck (referred to as step 211A in FIG. 2), and a third portion in the middle of the deck or "mids" (referred to as step 211C in FIG. 2). The second portion or "fines" are primarily comprised of fiber glass, epoxy resin, and plastic. The third portion or "mids" contain particles of "metals" that belong in the first portion as well as particles of "fines" that belong in the second portion. The first portion or "metals" is easily segregated and discharged into a "metals" collection bin 317 via duct 326 in FIG. 3 (shown as step 212 in FIG. 2). Likewise, the second portion of the light weight, finely ground, non-metallic base material or "fines" are easily segregated and discharged from the bottom of the deck into a "fines" collection bin 318 via screw conveyor 324, which is also preferably closed (shown as steps 213A and 213B in FIG. 2). Because of the (partial) vacuum maintained within first gravity separator 313, airborne particles, evident above the separating bed, are transported via duct 330 to second cyclone separator 315, where heavier weight particles from are separated and transported back to the process stream through second closed conveyor 310 and again onto third belt conveyor 311 and third closed conveyor 312 to first gravity separator 313, which is denoted by path 219 in FIG. 2. The "mids" fraction from first gravity separator 313 (or step 211 in FIG. 2) is transported via a fourth closed conveyor 333 into "mids" collection bin 331, as referenced by path 221, step 222, and path 220 in FIG. 2. Note, as shown in FIG. 3, an additional closed conveyor 329 and temporary "mids" collection bin 351 can be used along with fourth closed conveyor 333 to implement paths 221 and 220 in FIG. 2. "Mids" collection bin 331 is fitted with an adjustable gate 332 to allow material to be metered into closed conveyor 308 and returned to second crushing machine, such as hammer mill 309 in FIG. 3. The "mids" collection bin 331 permits a continuous flow of material to first gravity separator 313. At the beginning of the process, the dispensing gate 332 is partially opened. It is further opened as the flow of material from first belt conveyor 301 decreases to permit a continuous feed of material through second hammer mill 309, second cyclone separator 315 and onto first gravity separator 313. This process continues until the material in "mids" collection bin 331 has been completely dispensed and separated.

In addition, while not preferred, a magnetic separator can be inserted into the solid exit stream from first hammer mill 307. The magnetic separator should separate Ferromagnetic components, such as ferrous metals, from this solid stream prior to further separation. Note, however, the extracted metal portion may also contain substantial quantities of precious metals, such as Gold, Silver and Palladium attached the ferrous metals, which, in turn, may deplete the precious metal content of the processing stream.

Also, depending on the size of first hammer mill 307 and second hammer mill 309 and the attendant flow rate, alternate preferred embodiments may split up the stream of material from third closed conveyor 312 into two or more sub-streams, so that the material flows into first gravity separator 313 and into a second gravity separator (not shown), both of which are preferably fluidized bed separators, which are illustrated by step 211 in FIG. 2. Such a configuration prevents first gravity separator 313 from becoming overloaded. Alternate preferred embodiments may also produce approximately equivalent separation in both the first gravity separator 313 and a second gravity separator. As denoted by steps 211A and 211B in FIG. 2, granulated metals 211B in FIG. 2 may then be collected in both first "metal" collection bin 317 and a second "metal" collection bin (not shown) as "fines" are collected in both first "fines" collection bin 318 and a second "fines" collection bin (not shown). As denoted by step 211C in FIG. 2, "mids" may then be collected in both a first "mids" collection bin 331 and a second "mids" collection bin (not shown) or into a single "mids" collection bin 331. As with first gravity separator 313, airborne dust in a second gravity separator would be transported, via duct 330, back through second cyclone air separator 315 and then back to first gravity separator 313 and the second gravity separator.

As discussed above, the preferred processes and apparatus of size reduction and separation when applied to PWA's or PWB's from various sources produces a metallic portion or "metals" (A), a nonmetallic "fines" portion or "fines" (B), and a nonmetallic dust portion or "mids" (C) in various ratios depending on the composition of the initial PWA's or PWB's.

The metallic portion (A) is produced in a granular form that allows reproducible and reliable chemical analysis. As shown in Tables 1 and 2, chemical analysis of a typical sample of such a metal portion from printed wiring assemblies show the results achievable using the preferred processes and preferred apparatuses.

| Element | Weight % |
| --- | --- |
| Copper | 65.9 |
| Tin | 15.9 |
| Nickel | 0.8 |
| Iron | 0.8 |
| Calcium | 0.6 |
| Lead | <0.1 |
| Aluminum | <0.1 |
| Zinc | <0.1 |
| Sulfur | 1.1 |
| Carbon (from plastic components) | 14.8 |

| Element | Troy Oz. Per Ton |
| --- | --- |
| Gold | 7.55 |
| Silver | 24.92 |
| Platinum | <0.00 |
| Palladium | 0.79 |
| Rhodium | 0.43 |
| Ruthenium | 0.34 |

This metallic portion can then be further refined through precious metal refiners from which the various semiprecious and precious metals can be recovered and reused. When applied to PWB's, the process produces a granulated metallic portion that is 98–99.5% metals, the balance being small amounts of fiberglass and epoxy binding resin. The copper content of this metallic portion has been shown to be 88–93% pure, the balance being other metallic elements. At this level of purity, copper is readily and economically recovered by copper refineries and returned to use.

A typical sample of non-metallic portion (B) produced from PWA's has been analyzed and shown to contain 42.2% by weight of fiberglass and 45.5% by weight of epoxy resin, the balance composed of plastic components from the initial contained IC's and traces of metallic and non-metallic elements. Further analysis shows this portion to be composed of a distribution of particles of various sizes with the average particles 1000 microns in length.

A typical sample of non-metallic portion (C) produced from PWA's has been analyzed and shown to contain 34.3% by weight of fiberglass and 44.5% by weight of epoxy resin, the balance being composed of plastic components from the initial contained IC's and traces of metallic and non-metallic elements. Further analysis shows this portion to be composed of a distribution of particles of various sizes. Further analysis shows this portion to have an average particle size of 150 microns in length.

Samples of non-metallic portions (B) and (C) have been combined with virgin epoxy resin at loading as high as 75% by weight of these non-metallic portions and compression molded to produce composites with physical properties that suggest industrial applications.

FURTHER MODIFICATIONS AND VARIATIONS

Although the invention has been described with reference to a specific embodiment, this description is not meant to be construed in a limiting sense. The example embodiments shown and described above are only exemplary. Various modifications of the disclosed embodiment as well as alternate embodiments of the invention will become apparent to persons skilled in the art upon reference to the description of the invention. Alternate machinery may be used to separate the particles, other than that shown and discussed above. For instance, alternative crushing machines may be selected from a list including, but not limited to, Radial Knife Granulators, Roll Crushers, Jaw Crushers, Ball Mills, Disk Granulators, Impact Mills, and the like. Alternative air separators may be selected from a list including, but not limited to, Air Classifiers, Air Stratifyers, Centrifugal Air Classifiers, Venturi Separators, Trickle Vane Separators, Rising Current Density Separators, and the like. Alternative separators to gravity separators may be selected from a list including, but not limited to, Electrostatic Separators, Electrodynamic Separators, Vibrating Screen Separators, Destoners, and the like. Likewise, the number of crushing machines, conveyor belts, separators, and screens may vary as well, depending on the particular application. Thus, even though numerous characteristics and advantages of the present inventions have been set forth in the foregoing description, together with details of the structure and function of the inventions, the disclosure is illustrative only, and changes may be made in the detail, especially in matters of shape, size and arrangement of the parts within the principles of the inventions to the full extent indicated by the broad general meaning of the terms used in the attached claims. Accordingly, it should be understood that the modifications and variations suggested above and below are not intended to be exhaustive. These examples help show the scope of the inventive concepts, which are covered in the appended claims. The appended claims are intended to cover these modifications and alternate embodiments. In short, the restrictive description and drawings of the specific examples above are not intended to point out what an infringement of this patent would be, but are to provide at least one explanation of how to make and use the inventions contained herein. The limits of the inventions and the bounds of the patent protection are measured by and defined in the following claims.

What is claimed is:

1. A substantially non-metallic composition extracted from a printed wiring assembly, comprising
   (a) fiberglass extracted from said printed wiring assembly; and
   (b) epoxy resin extracted from printed wiring assembly, wherin said printed wiring assembly is comprised of at least one printed circuit board, wherein said fiberglass and is 42.2% by weight and said epoxy resin is 45.5% by weight.

2. The composition of claim 1, wherein said printed wiring assembly is comprised of a printed circuit board and at least one integrated circuit attached thereto, and further wherein said fiberglass and said epoxy resin is extracted from said printed circuit board and further comprising:
   (c) plastic components extracted from said at least one integrated circuit positioned on said printed circuit board.

3. The composition of claim 1, wherein said printed wiring assembly is comprised of a printed circuit board and at least one tegrated circuit attached thereto, and further comprising traces of metallic and non-metallic elements extracted from said printed circuit board and said at least one integrated circuit.

4. The composition of claim 1, wherein said fiberglass and said epoxy resin have an average particle size of 1000 microns in length.

5. The composition of claim 1, wherein said fiberglass extracted from said printed wiring assembly and said epoxy resin extracted from printed wiring assemblies have been shredded and crushed up together.

6. A composition derived from shredding and grinding at least one printed wiring assembly together, said at least one printed wiring assembly having at least one printed circuit board and at least one integrated circuit attached to said printed circuit board, comprising:
   (a) fiberglass extracted from said at leastone printed circuit booard of said at least one printed wiring assembly;
   (b) epoxy resin extracted from at least one printed circuit board of said at least one printed wiring assembly;
   (c) plastic componets extracted from said at least one integrated circuit positioned on said at least one printed circuit board; and
   (d) metallic elements extracted from said at least one integrated circuit board and said at least one integrated circuit, wherein said fiberglass comprises approximately between 34% to 42% by weight and said epoxy resin comprises approximately between 44% to 45% by weight.

7. The composition of claim 6, wherein said fiberglass and said epoxy resin is ground together and have an average particle size of 150–1000 microns in length.

8. The composition of claim 6, further comprising tin, nickel, and iron.

9. The composition of claim 6, further comprising sulfur, lead, Aluminum, and Zinc.

10. A substantially fiber glass, epoxy resin, and plastic product created by a process used to isolate fiber glass, epoxy resin, and plastic from at least one electronic circuit board, comprising the following steps:
    (a) repeatedly crushing and reducing by size said at least one electronic circuit board to create a plurality of crushed electronic components that conform to a specific size;
    (b) repeatedly separating portions of said plurality of crushed electronic components into non-metallic constituent components, metallic constituent components by weight, and mixed constituent components having both non-metallic constituent components and metallic constituent components, said non-metallic constituent components being said substantially fiber glass, epoxy resin, and plastic product; and
    (c) returning said mixed constituent components to be recrushed and reduced in size and reseparated in steps (a) and (b), wherein said product is comprised of said fiber glass approximately between 34% to 42% by weight and said epoxy resin approximately between 44% to 45% by weight.

11. The substantially fiber glass, epoxy resin, and plastic product of claim 10 wherein the process is further comprised of the step of
    (a1) providing said at least one electronic circuit board in a shredded state without cryogenic processing before step (a).

12. The substantially fiber glass, epoxy resin, and plastic product of claim 10, wherein the process is further comprised of
    (a1) transporting said at least one electronic circuit board to a crushing machine to perform step (a);
    (b1) transporting said plurality of crushed electronic components to a separating apparatus to perform step (b); and
    (c1) transporting said mixed constituent components to said crushing machine to be recrushed and reduced in size to perform step (c).

13. The substantially fiber glass, epoxy resin, and plastic product of claim 10, wherein the process is further comprised of the following substeps:
    (a1) providing said at least one electronic circuit board to a first crushing machine;
    (a2) crushing said at least one electronic circuit board to create a first plurality of crushed electrical components with said first crushing machine;
    (a3) transporting said first plurality of crushed electrical components to a second crushing machine; and
    (a4) crushing said at least one electronic circuit board to create said plurality of crushed electrical components with said second crushing machine.

14. The substantially fiber glass, epoxy resin, and plastic product of claim 13, wherein step (a) of the process is further comprised of:
    (a5) screening said first plurality of crushed electrical components to ensure said plurality of crushed electrical components substantially conforms to a first size; and
    (a6) screening said plurality of crushed electrical components to ensure said plurality of crushed electrical components substantially conforms to a second size, wherein said second size is smaller than said first size.

15. The substantially fiber glass, epoxy resin, and plastic product of claim 10, wherein the process if further comprised of the step of (d) removing and gathering dust associated with said plurality of crushed electronic components.

16. The substantially fiber glass, epoxy resin, and plastic product of claim 10, wherein the process is further comprised of
   (a0) shredding said at least one electronic circuit board before step (a).

17. The substantially fiber glass, epoxy resin, and plastic product of claim 10, wherein said plurality of crushed electronic components is comprised of at least one light-weight metallic constituent component and at least one light-weight non-metallic constituent component and the process is further comprised after step (a) of:
   (a1) removing at least one light-weight metallic constituent component and at least one light-weight non-metallic constituent component from said plurality of crushed electronic components;
   (a2) separating said at least one light-weight metallic constituent component from said at least one light-weight non-metallic constituent component, and
   (a3) returning said at least one light-weight metallic constituent component to said at least one crushed electrical components.

18. The substantially fiber glass, epoxy resin, and plastic product of claim 10, wherein said mixed constituent components has at least one light-weight metallic constituent component and at least one light-weight non-metallic constituent component, and the process is further comprised after step (d):
   (d1) removing at least one light-weight metallic constituent component and at least one light-weight non-metallic constituent component from said mixed constituent components;
   (d2) separating said at least one light-weight metallic constituent component from said at least one light-weight non-metallic constituent component; and
   (d3) returning said at least one light-weight metallic constituent component to said at least one mixed constituent component.

19. The composition of claim 1, wherein said printed wiring assembly is comprised of a printed circuit board, and further comprising traces of metallic and non-metallic elements extracted from said printed circuit board.

20. The composition of claim 1, wherein said printed wiring assembly is comprised of a printed circuit board, and further comprising traces of metallic and non-metallic elements extracted from said printed circuit board.

21. The composition of claim 6, wherein said fiberglass is 34.3% by weight and said epoxy resin is 45% by weight.

22. The composition of claim 1, wherein said fiberglass and said epoxy resin have an average particle size of 150 microns in length.

23. A substantially non-metallic composition extracted from a printed wiring assembly, comprising
   (a) fiberglass extracted from said printed wiring assembly; and
   (b) epoxy resin extracted from printed wiring assembly, wherein said printed wiring assembly is comprised of at least one printed circuit board, wherein said fiberglass and said epoxy resin is extracted from said at least one printed circuit board, wherein said fiberglass is 34.3% by weight and said epoxy resin is 44.5% by weight.

24. The composition of claim 23, wherein said printed wiring assembly is comprised of a printed circuit board and at least one integrated circuit attached thereto, and further wherein said fiberglass and said epoxy resin is extracted from said printed circuit board and further comprising:
   (c) plastic componets extracted from said at least one integrated circuit positioned on said printed board.

25. The composition of claim 23, wherein said printed wiring assembly is comprised of a printed circuit board and at least one integrated circuit attached thereto, and further comprising traces of metallic and non-metallic elements extracted from said printed circuit board and said at least one integrated circuit.

26. The composition of claim 23, wherein said fiberglass and said epoxy resin have an average particle size of 1000 microns in length.

27. The composition of claim 23, wherein said fiberglass extracted from said printed wiring assembly and said epoxy resin extracted from printed wiring assemblies have been shredded and crushed up together.

28. The composition of claim 23, wherein said fiberglass and said epoxy resin have an average particle size of 150 microns in length.

29. The composition of claim 23, wherein said printed wiring assembly is comprised of a printed circuit board, and further comprising traces of metallic and non-metallic elements extracted from said printed circuit board.

30. The composition of claim 29, wherein said metals extracted from said at least one printed circuit board of said printed wiring assemblies are 88%–93% pure copper.

31. A composition derived from shredding and grinding at least one printed wiring assembly together, said at least one printed wiring assembly having at least one printed circuit board and at least one integrated circuit attached to said printed circuit board, comprising:
   (a) fiberglass extracted from said at least one printed circuit board of said at least one printed wiring assembly;
   (b) epoxy resin extracted from at least one printed circuit board of said at least one printed wiring assembly;
   (c) plastic components extracted from said at least one integrated circuit positioned on said at least one printed circuit board; and
   (d) metallic elements extracted from said at least one integrated circuit board and said at least one integrated circuit.

32. The composition of claim 31, wherein said fiberglass and said epoxy resin is ground together and have an average particle size of 150-1000 microns in length.

* * * * *